(12) United States Patent
Bchir et al.

(10) Patent No.: US 7,831,115 B2
(45) Date of Patent: Nov. 9, 2010

(54) OPTICAL DIE STRUCTURES AND ASSOCIATED PACKAGE SUBSTRATES

(75) Inventors: Omar Bchir, Phoenix, AZ (US); Islam Salama, Chandler, AZ (US); Charan Gurumurthy, Higley, AZ (US); Houssam Jomaa, Phoenix, AZ (US); Ravi Nalla, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 12/052,650

(22) Filed: Mar. 20, 2008

(65) Prior Publication Data

US 2009/0238233 A1 Sep. 24, 2009

(51) Int. Cl.
G02B 6/12 (2006.01)
G02B 6/036 (2006.01)

(52) U.S. Cl. .............................. 385/14; 385/31; 385/127

(58) Field of Classification Search ........................ None
See application file for complete search history.

(56) References Cited

U.S. PATENT DOCUMENTS

| | | | | |
|---|---|---|---|---|
| 4,000,416 | A * | 12/1976 | Goell | 385/123 |
| 4,252,403 | A * | 2/1981 | Salisbury | 385/28 |
| 4,314,740 | A * | 2/1982 | Bickel | 385/47 |
| 5,362,976 | A * | 11/1994 | Suzuki | 257/81 |
| 5,627,934 | A * | 5/1997 | Muhs | 385/127 |
| 6,285,808 | B1 * | 9/2001 | Mehlhorn et al. | 385/14 |
| 6,858,475 | B2 | 2/2005 | Gurumurthy et al. | |
| 6,869,229 | B2 * | 3/2005 | Reedy et al. | 385/88 |
| 6,965,469 | B2 * | 11/2005 | Avizonis et al. | 359/341.1 |
| 7,013,562 | B2 | 3/2006 | Gurumurthy et al. | |
| 7,042,077 | B2 | 5/2006 | Walk et al. | |
| 7,146,106 | B2 * | 12/2006 | Yang et al. | 398/138 |
| 7,149,376 | B2 * | 12/2006 | Uchida et al. | 385/15 |
| 7,237,334 | B2 | 7/2007 | Salama et al. | |
| 2004/0156578 | A1 * | 8/2004 | Geusic et al. | 385/14 |
| 2007/0086696 | A1 * | 4/2007 | Hsu | 385/14 |
| 2007/0148951 | A1 | 6/2007 | Pang et al. | |
| 2007/0152024 | A1 | 7/2007 | Pang et al. | |
| 2008/0042248 | A1 | 2/2008 | Nalla et al. | |
| 2008/0247704 | A1 * | 10/2008 | Kodama et al. | 385/14 |
| 2009/0223044 | A1 * | 9/2009 | Cho et al. | 29/846 |

OTHER PUBLICATIONS

Salama, Islam et al., "Microelectronic Device Including Bridging Interconnect to Top Conductive Layer of Passive Embedded Structure and Method of Making Same", U.S. Patent Application filed on Dec. 13, 2006 assigned U.S. Appl. No. 11/610,385.

(Continued)

*Primary Examiner*—Michelle R Connelly Cushwa
(74) *Attorney, Agent, or Firm*—Cool Patent, P.C.; Joseph P. Curtin

(57) ABSTRACT

Optical die structures and associated package substrates are generally described. In one example, an electronic device includes a package substrate having a package substrate core, a dielectric layer coupled with the package substrate core, and one or more input/output (I/O) optical fibers coupled with the package substrate core or coupled with the build-up dielectric layer, or combinations thereof, the one or more I/O optical fibers to guide I/O optical signals to and from the package substrate wherein the one or more I/O optical fibers allow both input and output optical signals to travel through the one or more I/O optical fibers.

23 Claims, 5 Drawing Sheets

OTHER PUBLICATIONS

Salama, Islam et al., "Microelectronic Substrate Including Embedded Components and Spacer Layer and Method of Forming Same", U.S. Patent Application filed on Dec. 11, 2006 assigned U.S. Appl. No. 11/609,297.

Pang, Mengzhi et al., "Microelectronic Die Including Solder Caps on Bumping Sites Thereof and Method of Making Same", U.S. Patent Application filed on Dec. 28, 2006 assigned U.S. Appl. No. 11/617,589.

Lu, Daoqiang et al., "Assembly of Thin Die Coreless Package", U.S. Patent Application filed on Dec. 29, 2006 assigned U.S. Appl. No. 11/648,120.

Matayabas Jr, James C., et al., "Methods for Electroless Plating of Metal Traces on a Substrate and Devices and Systems Thereof", U.S. Patent Application filed on Dec. 29, 2006 assigned U.S. Appl. No. 11/618,528.

Li, Te et al., "High-power InGaAs VCSEL's single devices and 2-D arrays", Journal of Luminescence 122-123, (2007), pp. 571-573.

* cited by examiner

US 7,831,115 B2

OPTICAL DIE STRUCTURES AND ASSOCIATED PACKAGE SUBSTRATES

BACKGROUND

Generally, input/output (110) signals between a package substrate and integrated circuit (IC) device, such as a semiconductor die, are electrically routed via metal bumps that couple the package substrate and IC device.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
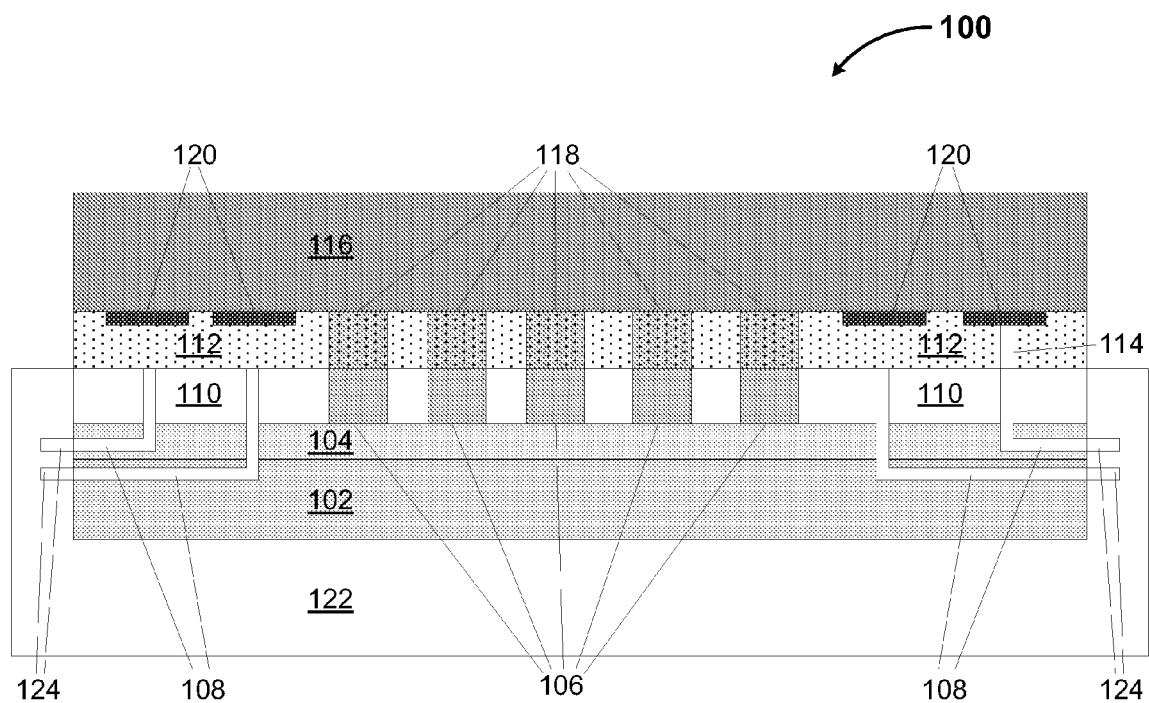
FIG. 1 is an elevation view cross-section schematic of an electronic device comprising optical die structures and associated package substrates, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of optical die structures and associated package substrates are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is an elevation view cross-section schematic of an electronic device comprising optical die structures and associated package substrates, according to but one embodiment. In an embodiment, an electronic device 100 includes a package substrate 102, 104 comprising at least a package substrate core 102, a build-up dielectric layer 104, and one or more I/O optical fibers 108, coupled as shown. An electronic device 100 may further include one or more package substrate power-delivery bumps 106, solder-resist layer 110, underfill 112, and coupler 114, coupled as shown.

In other embodiments, an electronic device 100 further includes a semiconductor die 116 comprising one or more semiconductor die power-delivery bumps 118 and one or more I/O optical structures 120. An electronic device 100 may further include a circuit board 122 comprising one or more I/O optical structures 124, coupled as shown. Bumps 106, 118 as used throughout this specification may refer to any electrically conductive interconnect structure including, for example, columns or bumps of metal or alloys. The individual features of electronic device 100 may be exaggerated for the sake of clarity of discussion and may include more or less features of different size or scale in other embodiments.

In an embodiment, an electronic device 100 includes a package substrate comprising a package substrate core 102, a dielectric layer 104 coupled with the package substrate core 102, and one or more input/output (I/O) optical fibers 108 coupled with the package substrate core 102 or coupled with the dielectric layer 104, or combinations thereof. Dielectric layer 104 may be a build-up dielectric layer in an embodiment. A package substrate core 102 may include, for example, epoxy-based material, such as fiberglass-reinforced epoxy. A build-up dielectric 104 may include an epoxy-based material, which may be filled or unfilled. In an embodiment, the one or more I/O optical fibers 108 are woven into a substrate core 102 material or deposited into a build-up dielectric layer 104, or combinations thereof. In an embodiment in which the one or more I/O optical fibers 108 are woven into a substrate core 102, a coupler may be used to optically couple one or more I/O optical fibers 108 woven into a substrate core with, for example, one or more I/O optical fibers 108 deposited into a dielectric layer 104. An electronic device 100 may further include one or more package substrate power-delivery bumps 106 coupled to a central region of the package substrate 102, 104. In an embodiment, a package substrate comprises a printed circuit board (PCB).

One or more I/O optical fibers 108 may guide I/O optical signals to and from a package substrate 102, 104. In an embodiment, one or more I/O optical fibers 108 allow both input and output optical signals to travel through the one or more I/O optical fibers 108. For example, an I/O optical fiber 108 may include means to guide an optical input signal and also include means to guide an optical output signal. In an embodiment, one or more I/O optical fibers 108 include a first core and a second core, the first core being an input signal pathway and the second core being an output signal pathway. A cladding material may be coupled to the first core and disposed between the first core and the second core. The first core may be a central structure of the one or more I/O optical fibers 108 and the second core may be a structure that surrounds the first core. In an embodiment, the first core is a circular structure and the second core is an annular structure.

In another embodiment, one or more I/O optical fibers 108 include one or more multimode fibers. The one or more multimode fibers may include a single core structure that allows an input signal of a first wavelength and an output signal of a second wavelength to travel along the single core, in which the first wavelength is different than the second wavelength.

Figure 2:
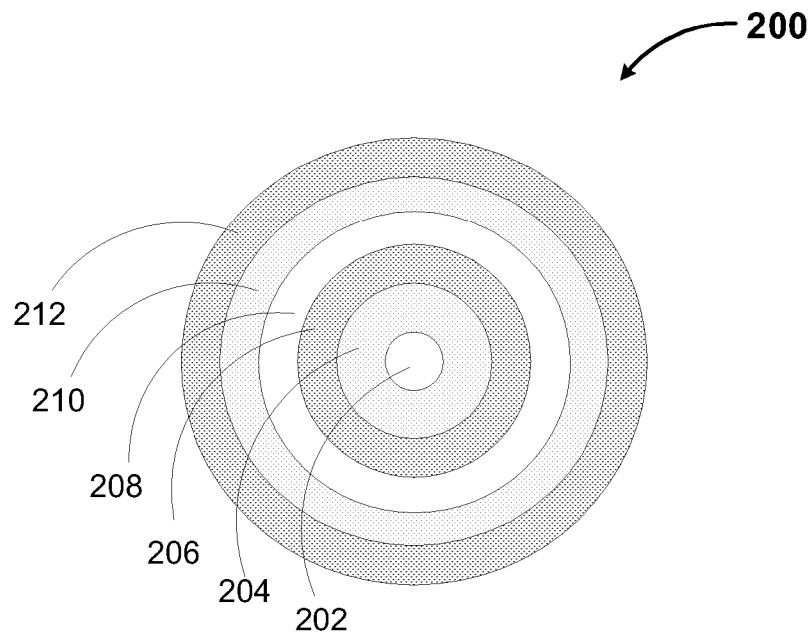
FIG. 2 is a cross-section schematic of an optical fiber, according to but one embodiment.
Figure 3:
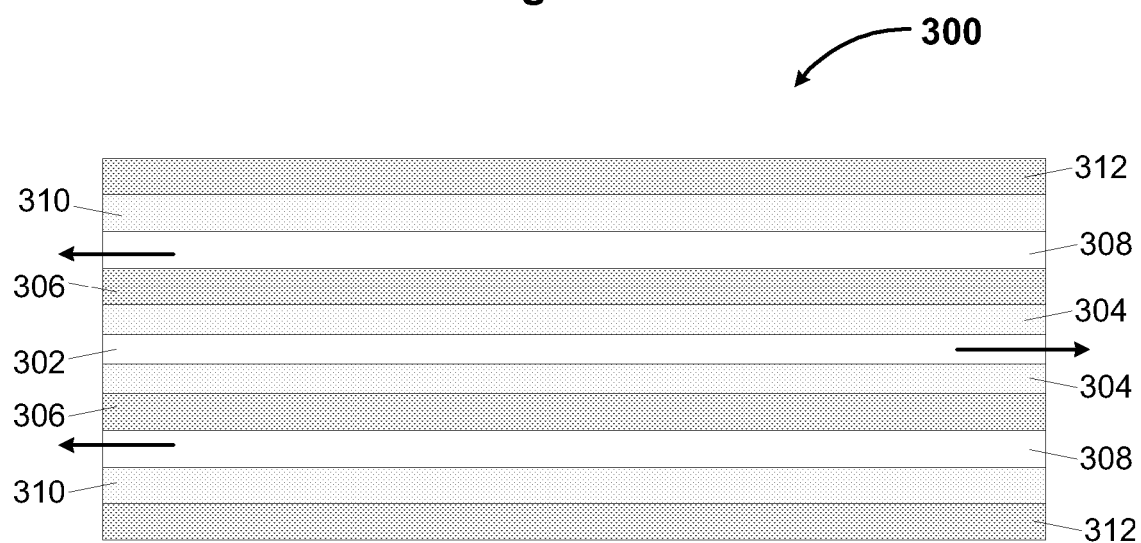
FIG. 3 is another cross-section schematic of an optical fiber, according to but one embodiment.

Embodiments relating to one or more I/O optical fibers 108 may be further described with respect to FIGS. 2-3.

An electronic device 100 may further include a semiconductor die 116 coupled with the package substrate 102, 104. The semiconductor die 116 may be an integrated circuit (IC) device including logic and/or memory, such as a processor or any other semiconductor device 116 to be coupled with package substrates 102, 104, and/or circuit boards 122. In an embodiment, a semiconductor die 116 includes one or more semiconductor die power-delivery bumps 118. The one or more semiconductor die power-delivery bumps 118 may be coupled to a central region of the semiconductor die 116 according to an embodiment. In another embodiment, the one or more semiconductor die power-delivery bumps 118 are electrically coupled with the package substrate power-delivery bumps 106. The power-delivery bumps 106, 118 may be coupled together by a soldering process. The power-delivery bumps 106, 118 may include copper (Cu), solder materials, or combinations thereof. In an embodiment, the power-delivery bumps 106, 118 have a surface finish coating.

A semiconductor die 116 may further include one or more I/O optical structures 120. The one or more I/O optical structures 120 may guide I/O optical signals to and from the semiconductor die 116 and may be disposed in a peripheral region of the semiconductor die 116 according to one or more embodiments. In an embodiment, the one or more I/O optical structures 120 include light-emitting diodes (LED), lasers, or combinations thereof. In another embodiment, one or more I/O optical structures 120 include optical contacts.

One or more I/O optical structures 120 may include a circular light emitter disposed in a central region of the one or more I/O optical structures 120 to transmit I/O optical signals from the semiconductor die 116. The one or more I/O optical structures 120 may further include an annular light receiver disposed in a peripheral region of the one or more I/O optical structures 120 that surrounds the circular light emitter to receive I/O optical signals from other sources such as from package substrate 102, 104, or circuit board 122, or other electronic devices or systems coupled with the semiconductor die 116. A divider may be disposed between the circular light emitter and the annular light receiver in an embodiment.

One or more I/O optical structures 120 may include one or more vertical cavity surface emitting lasers (VCSEL) in an embodiment. The one or more VCSELs may comprise one or more group III-V semiconductor films including at least one group III-V semiconductor film that provides a quantum-well light source for the one or more I/O optical structures 120 of the semiconductor die 116. In other embodiments, one or more VCSELs comprise suitable materials other than group III-V semiconductor materials and may not be limited to any particular type of material. The one or more VCSELs 120 may be coupled to a peripheral region of the semiconductor die 116 and the one or more semiconductor die power-delivery bumps 118 may be coupled to a central region of the semiconductor die 116. Such arrangement may at least facilitate shorter I/O optical signal paths between a semiconductor die 116, a substrate 102, and a circuit board 122. Embodiments relating to one or more I/O optical structures 120 may be further described with respect to FIGS. 4-5.

An electronic device 100 may further include a solder resist layer 110 coupled with the build-up dielectric layer 104 and an underfill layer 112 coupled with the solder resist layer 110, the underfill layer 112 also being coupled with the semiconductor die 116. Solder-resist layer 110 may include a polymer material, such as a polyacrylate-based photosensitive material. In an embodiment, underfill layer 112 comprises an optically transparent underfill 112. Underfill layer 112 may include an epoxy-based material. Other suitable materials for layers 110, 112 may be used in other embodiments.

In an embodiment, the one or more I/O optical structures 120 of the semiconductor die 116 are optically coupled to the one or more I/O optical fibers 108 of the package substrate 102, 104. One I/O optical structure 120 may be associated or coupled to one optical fiber 108 such that a dedicated trace 108 exists for an I/O optical structure 120. In an embodiment, the one or more I/O optical structures 120 and the one or more I/O optical fibers 108 are substantially aligned to allow transmission of optical signals, reception of optical signals, or combinations thereof, through an optically transparent underfill layer 112. In another embodiment, the one or more I/O optical structures 120 and the one or more I/O optical fibers 108 are directly coupled together using a coupler 114. The coupler 114 may be an optical coupler that includes an extension of the one or more optical fibers 108 that is coupled to the one or more I/O optical structures 120. In another embodiment, the coupler 114 comprises an I/O optical structure 120 that houses the termination of the one or more I/O optical fibers 108.

An electronic device 100 may further include a circuit board 122 coupled with the package substrate 102, 103. A circuit board 122 may include a motherboard, a printed circuit board (PCB), any other circuit board, or combinations thereof, in one or more embodiments. A circuit board 122 may include one or more I/O optical structures 124. In an embodiment, the one or more I/O optical structures 124 of the circuit board 122 include partner I/O optical fibers coupled to the one or more I/O optical fibers 108 of the package substrate 102, 104. In another embodiment, the one or more I/O optical structures 124 of the circuit board 122 include I/O optical contacts. In an embodiment, a semiconductor die 116 is optically coupled with a circuit board 122 through a coreless or bumpless build-up layer (BBUL) interposer, or similar device. In such embodiment, the semiconductor die 116 may be mounted on a high-density interconnect (HDI) circuit board 122, and subsequently mounted to another circuit board, such as a motherboard. In another embodiment, an interposer is coupled with a semiconductor die 116 and a circuit board 122 is optically coupled with the semiconductor die 116 through the interposer.

In one embodiment, a semiconductor die 116 is coupled with a circuit board 122 by direct-chip attach (DCA). A semiconductor die 116 may be coupled with a circuit board 122 by DCA wherein one or more optical fibers 108 are directly coupled to the circuit board 122, the one or more optical fibers 108 also being optically coupled with the I/O optical structures 120 of the semiconductor die. In another embodiment, a package substrate 102, 104 is embedded or mounted into the circuit board 122 as depicted.

The I/O optical structures 124 of the circuit board 122 may comprise light emitters, light receivers, and/or light transceivers, or combinations thereof, to process I/O optical signals traveling to or from the semiconductor die 116. Using optical signals for I/O signals between a semiconductor die 116, package substrate 102, 104, and/or a circuit board 122, or other electronic devices may greatly increase I/O data rate compared to current electrical I/O signals. Optical I/O signals may also be decoupled from the power delivery benefiting electrical crosstalk. Using optical signals for I/O signals may also allow continued scaling of first-level interconnect (FLI) and/or second-level interconnect (SLI) pitch by reducing the area required to route I/O signals, to allow or accommodate the potential scaling of smaller semiconductor dies 116 and/or substrates 102.

FIG. 2 is a cross-section schematic of an optical fiber, according to but one embodiment. In an embodiment, an optical fiber 200 includes a first core 202, first cladding 204, first buffer 206, second core 208, second cladding 210, and second buffer 212, coupled as shown. An optical fiber 200 may guide I/O optical signals to and from electronic devices, such as a semiconductor die, package substrate, or circuit board. In an embodiment, an optical fiber 200 allows both input and output optical signals to travel through the optical fiber 200. An optical fiber 200 may comprise annular, coaxial, and/or multi-mode fibers, or suitable combinations thereof. In other embodiments, an optical fiber 200 for use with I10 optical signals includes more or less features than depicted in FIG. 2.

For example, an I/O optical fiber 200 may include a first core 202 and a second core 208, the first core 202 being an input signal pathway and the second core 208 being an output signal pathway, in an embodiment. In another embodiment, the first core 202 is an output signal pathway and the second core 208 is an input signal pathway. In other words, either the first core 202 or the second core 208 may be an input signal pathway or an output signal pathway. A first cladding 204 material may be coupled to the first core 202 and disposed between the first core 202 and the second core 208. In an embodiment, a first cladding 204 is coupled to the first core 202 and a second core 208 is coupled to the first cladding 204. The first core 202 may be a circular, central structure of the optical fiber 200 and the second core 208 may be an annular structure that surrounds the first core 202. In an embodiment, an optical fiber 200 only includes a first core 202, first cladding 204, and a second core 208.

In an embodiment, an optical fiber 200 comprises glass material. For example, a first core 202, second core 208, first cladding 204 and/or second cladding 210 may comprise silica ($SiO_2$) based glass and may include dopants. A first cladding 204 or second cladding 210 may comprise, for example, phosphorous oxychloride ($POCl_3$), tetrachlorogermane ($GeCl_4$), or other suitable materials. The first core 202 may be doped to have a different index of refraction than the first cladding 204 such that an I/O optical signal travels along the first core 202. Analogous processing and effects may also apply to a second core 208 and second cladding 210. In alternative embodiments, an optical fiber 200 includes polymer-based materials. For example, optical fiber cores 202, 208 may comprise polymethyl methacrylate and cladding 204, 210 may comprise fluorinated polymer material. Alternative materials suitable for an optical fiber 200 may be used in other embodiments. Material for cladding 204, 210 may be selected to contain or confine light signals within the cores 202, 208.

A first buffer 206 and/or a second buffer 212 may provide moisture protection or structural strengthening for an optical fiber 200. In an embodiment, buffers 206, 212 include resin-based materials, low-porosity polymer, or combinations thereof. An optical fiber 200 may further include a jacket (not depicted) to provide further protection and/or strengthening of the optical fiber 200. In an embodiment, a jacket includes polyvinyl chloride (PVC). Other suitable materials may be used for buffers 206, 212 and/or jacket in other embodiments. In an embodiment, buffers 206, 212 and/or jacket structures are not used or reduced to a suitable thickness to comport with embodiments described herein.

An optical fiber 200 may be fabricated in a variety of sizes. In an embodiment, a first core 202 has a diameter that ranges between about 1 to 5 microns and a first cladding 204 has a diameter that ranges between about 50 to 150 microns. Such dimensions are merely examples and fiber 200 is not necessarily limited to these dimensions and may include other diameters or dimensions in other embodiments.

An optical fiber 200 may be fabricated by sequentially depositing structures 204, 206, 208, 210 and/or 212 to the first core 202. In an embodiment, fabricating an optical fiber 200 includes depositing a first cladding material to a first core material of the one or more I/O optical fibers, depositing a second core material to the first cladding material, sintering at least the first core material, the first cladding material, and the second core material, and drawing at least the first core material, the first cladding material, and the second core material to form the one or more I/O optical fibers of the package substrate. Analogous fabrication may be used with more or less structures than depicted with respect to optical fiber 200.

FIG. 3 is another cross-section schematic of an optical fiber, according to but one embodiment. FIG. 3 may be a cross-section along the length of an optical fiber. In an embodiment, an optical fiber 300 may include a first core 302, first cladding 304, first buffer 306, second core 308, second cladding 310, and second buffer 312, coupled as shown. Structures 302, 304, 306, 308, 310, 312 of an optical fiber 300 may comport with embodiments already described with respect to similarly identified structures of optical fiber 200.

In an embodiment, a first core 302 provides a pathway for an optical signal to travel in a first direction indicated by the arrow of the first core 302 and a second core 308 provides a pathway for an optical signal to travel in a second direction indicated by the arrows of the second core 308. In an embodiment, an optical signal that uses the first core 302 as a pathway travels in a direction that is substantially opposite the direction of an optical signal that uses the second core 308 as a pathway. An optical signal traveling in the first direction may be an input optical signal or an output optical signal and an optical signal traveling in the second direction may be an input optical signal or an output optical signal depending on the perspective of the electronic devices optically coupled together by the optical fiber 300 according to one or more embodiments.

Figure 4:
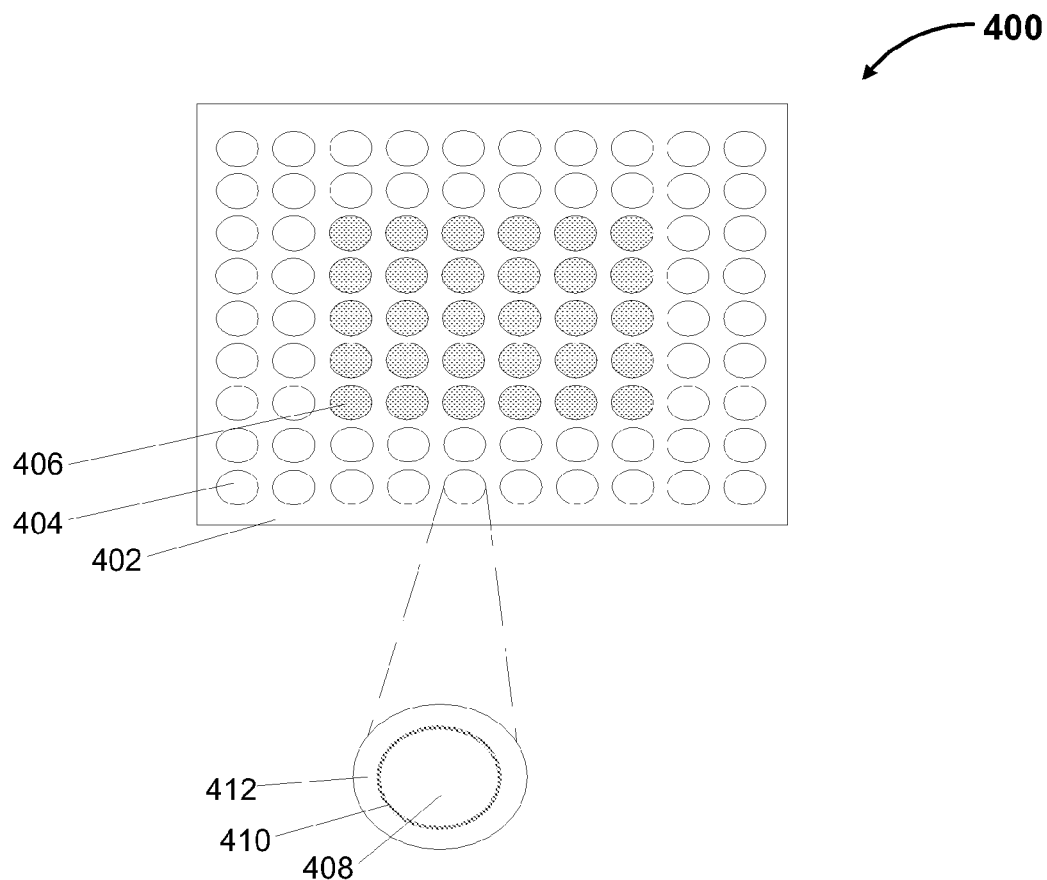
FIG. 4 is a top plan view schematic of a semiconductor die comprising one or more optical die structures, according to but one embodiment.

FIG. 4 is a top plan view schematic of a semiconductor die comprising one or more optical die structures, according to but one embodiment. In an embodiment, a semiconductor die 400 includes a processed surface 402 of a semiconductor die 400, one or more I/O optical structures 404, and one or more power delivery bumps 406, coupled as shown. A processed surface 402 may be a surface of the semiconductor die 400 upon which integrated circuit (IC) structures are fabricated.

A semiconductor die 400 may include one or more power delivery bumps 406 and one or more I/O optical structures 404 to guide I/O optical signals to and from the semiconductor die 400. In an embodiment, the one or more power delivery bumps 406 are coupled to a central region of the semiconductor die 400 and the one or more I/O optical structures 404 are coupled to a peripheral region of the semiconductor die 400. Other arrangements may be used in other embodiments.

The one or more I/O optical structures 404 may include light-emitting diodes (LED), lasers, or combinations thereof. In an embodiment, the one or more I/O optical structures 404 include a circular light emitter 408 disposed in a central region of the one or more I/O optical structures 404 to transmit I/O optical signals from the semiconductor die 400. One or more I/O optical structures 404 may further include an annular light receiver 412 disposed in a peripheral region of the one or more I/O optical structures 404 that surrounds the circular light emitter to receive I/O optical signals and a divider 410 disposed between the circular light emitter 408 and the annular light receiver 412. The divider 410 may comprise a dielectric material.

Figure 5:
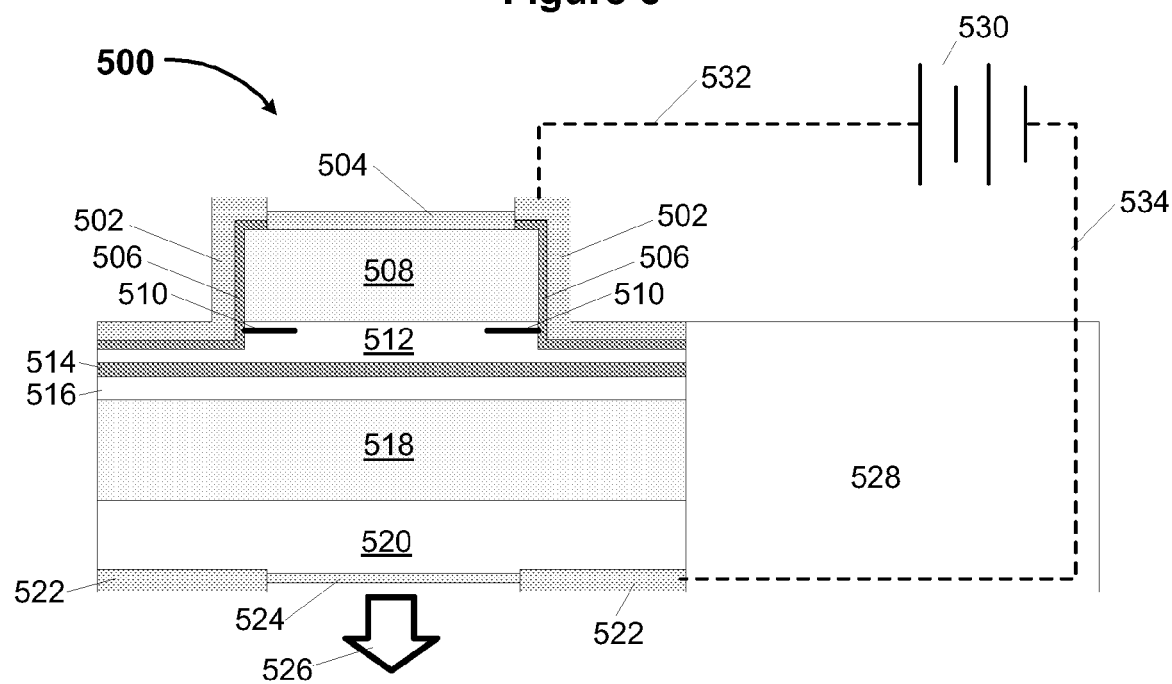
FIG. 5 is an elevation view cross-section schematic of a vertical cavity surface emitting laser (VCSEL) structure, according to but one embodiment.

FIG. 5 is an elevation view cross-section schematic of a vertical cavity surface emitting laser (VCSEL) structure, according to but one embodiment. In an embodiment, a VCSEL structure 500 includes a p-contact 502, electrically conductive I/O structure 504, passivation 506, p-type distributed Bragg reflector (DBR) 508, aperture 510, group III-V semiconductor material 512, one or more quantum wells 514, group III-V semiconductor material 516, n-type DBR 518, group III-V semiconductor material 520, n-contact 522, anti-reflective coating 524, and optical signal 526, coupled as shown. A VCSEL structure 500 may further include an isolation region 528, I/O power 530, and power leads 532, 534, coupled as shown.

Various elements of a VCSEL structure 500 may include one or more group III-V semiconductor materials or films such as, for example, elements 508, 512, 514, 516, 518, 520. In an embodiment, one or more group III-V semiconductor films include gallium arsenide (GaAs), indium gallium arsenide (InGaAs), indium phosphide (InP), silicon, various dopants, or combinations thereof. Other suitable photoelectronic materials may be used in other embodiments. A VCSEL structure 500 may include one or more group III-V semiconductor films 508, 512, 514, 516, 518, 520 wherein at least one of the group III-V semiconductor films includes a quantum well 514 light source for an I/O optical structure of a semiconductor die.

Fabricating a VCSEL structure 500 may include depositing one or more group III-V semiconductor films 508, 512, 514, 516, 518, 520 to an electrically conductive I/O structure 504. The electrically conductive I/O structure 504 may be disposed in the backend region of a semiconductor die. The backend region may include, for example, interconnect structures to couple one or more integrated circuit (IC) devices of the semiconductor die with other electronic devices. P-type DBR 508 may be deposited to the electrically conductive I/O structure 504, group III-V semiconductor material 512 may be coupled to P-type DBR 508, and so forth.

Fabricating a VCSEL structure 500 may further include patterning the one or more deposited group III-V semiconductor films to form a circular light emitting region of one or more I/O optical structures and/or coupling the VCSEL 500 to an I/O power source 530. A power source 530 may be electrically coupled to the p-contact 502 by lead 532 and coupled to the n-contact 522 by lead 534 through the isolation region 528. An n-contact 522 and p-type contact 502 may be electrical contacts that are formed during backend processing of the semiconductor die. Isolation region 528 may include a dielectric material compatible with the semiconductor materials. Optical signal 526 may be an output optical signal of a semiconductor die, in an embodiment.

Figure 6:
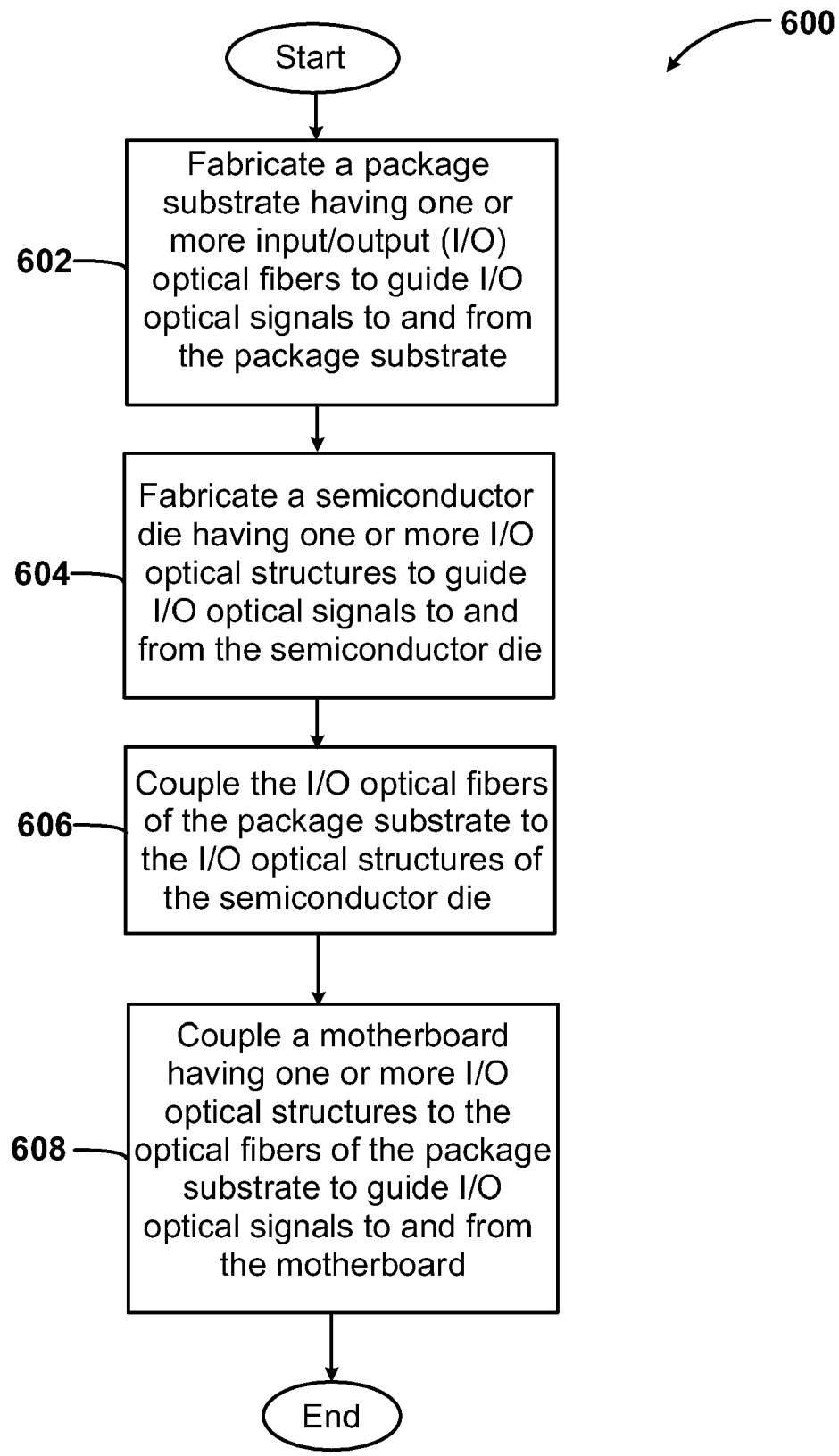
FIG. 6 is a flow diagram of a method for fabricating optical die structures and associated package substrates, according to but one embodiment.

FIG. 6 is a flow diagram of a method for fabricating optical die structures and associated package substrates, according to but one embodiment. In an embodiment, a method 600 includes fabricating a package substrate having one or more I/O optical fibers to guide I/O optical signals to and from the package substrate at box 602, fabricating a semiconductor die having one or more I/O optical structures to guide I/O optical signals to and from the semiconductor die at box 604, and coupling the I/O optical fibers of the package substrate to the I/O optical structures of the semiconductor die at box 606. A method 600 may further include coupling a circuit board having one or more I/O optical structures to the optical fibers of the package substrate to guide I/O optical signals to and from the circuit board at box 608.

In an embodiment, a method 600 includes fabricating a package substrate comprising one or more I/O optical fibers to guide I/O optical signals to and from the package substrate 602 wherein the one or more I/O optical fibers allow both input and output optical signals to travel through the one or more I/O optical fibers. A method 600 may further include fabricating a semiconductor die comprising one or more I/O optical structures to guide I/O optical signals to and from the semiconductor die 604 wherein the one or more I/O optical structures comprise light-emitting diodes (LED), lasers, or combinations thereof and optically coupling the one or more I/O optical structures of the semiconductor die with the one or more I/O optical fibers of the package substrate 606.

Fabricating a package substrate 602 may include fabricating an optical fiber. In an embodiment, fabricating a package substrate 602 includes depositing a first cladding material to a first core material for one or more I/O optical fibers, depositing a second core material to the first cladding material, sintering at least the first core material, the first cladding material, and the second core material, and drawing at least the first core material, the first cladding material, and the second core material to form the one or more I/O optical fibers of the package substrate. Deposition may be accomplished by gas-phase deposition or any other suitable method. Fabricating a package substrate 602 may further include weaving the one or more I/O optical fibers into a substrate core of the package substrate or depositing the one or more I/O optical fibers into a build-up dielectric layer of the package substrate. For example, the I/O optical fibers may be woven around fiberglass material in a fiberglass-reinforced epoxy core of the package substrate.

During backend processing of a semiconductor die, deposition processes may be used to form light emitters and receivers on a semiconductor die. Fabricating a semiconductor die 604 may include depositing one or more group III-V semiconductor films to one or more electrically conductive I/O structures of a semiconductor die wherein at least one of the group III-V films is disposed to provide a quantum well light source for the one or more I/O optical structures of the semiconductor die. Light emitter and receiver regions may be deposited in an annular fashion. For example, an InGaAs VCSEL, which emits light having a wavelength of about 980 nm, may be formed by deposition. Deposition may be accomplished by any thin films deposition method including atomic layer deposition (ALD), chemical vapor deposition (CVD), physical vapor deposition (PVD), or combinations thereof.

Fabricating a semiconductor die 604 may further include patterning the one or more deposited group III-V semiconductor films to form a circular light emitting region of the one or more I/O optical structures and an annular light absorbing region coupled to the circular light emitting region wherein the annular light absorbing region surrounds the circular light emitting region. Patterning may include, for example, lithography, etch, and/or polish processes. Other semiconductor fabrication processes may be used in other embodiments. In an embodiment, fabricating a semiconductor die 604 includes coupling the I/O optical structures of the semiconductor die to an I/O power source. Electrical contacts of the I/O optical structures may be formed and coupled to the I/O power source during backend processing of the semiconductor die.

Fabricating a semiconductor die 604 may further include covering the I/O optical structures of the semiconductor die using a protective film, depositing one or more power delivery bumps to the semiconductor die, and removing the protective film from the I/O optical structures. For example, after one or more I/O optical structures of the semiconductor die have been deposited, a protective film such as photoresist may be deposited to cover the I/O optical structures followed by sputtering or electroplating of power delivery bumps to the semiconductor die. After power delivery bumps have been deposited, photoresist may be removed.

Optically coupling the one or more I/O optical structures of the semiconductor die with the one or more I/O optical fibers of the package substrate 606 may include depositing an underfill between the package substrate and the semiconductor die and coupling the one or more I/O optical fibers directly to the one or more I/O optical structures. In another embodiment, optically coupling the one or more I/O optical structures of the semiconductor die with the one or more I/O optical fibers of the package substrate 606 includes depositing an optically transparent underfill between the package substrate and the semiconductor die and aligning the one or more I/O optical fibers with the one or more I/O optical structures to allow optical signals to travel through the optically transparent underfill.

A method 600 may further include coupling a circuit board with the package substrate 608, the circuit board comprising one or more I/O optical structures. The one or more I/O optical structures of the circuit board may be optically coupled to the one or more I/O optical fibers of the package substrate to guide I/O optical signals to and from the circuit board. A package substrate coupled with a semiconductor die may be mounted or embedded in a circuit board as depicted in FIG. 1 to provide a short route for I/O optical signals between the semiconductor die and the circuit board. In other embodiments, a direct-chip attach (DCA) method or other suitable coupling method is used to couple a semiconductor die with a circuit board.

Various operations may be described as multiple discrete operations in turn, in a manner that is most helpful in understanding the claimed subject matter. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 7:
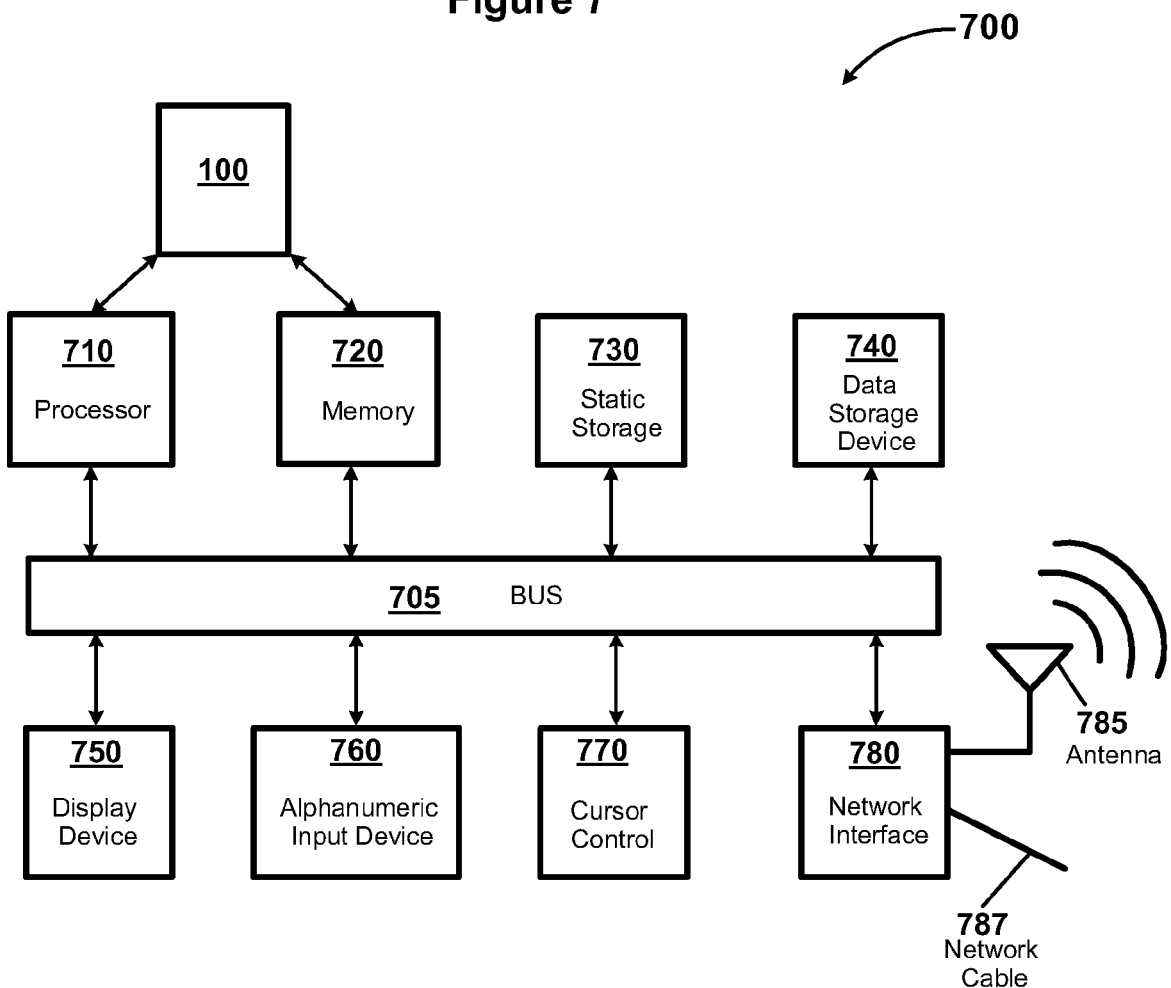
FIG. 7 is a diagram of an example system in which the electronic device as described herein may be used, according to but one embodiment.

FIG. 7 is a diagram of an example system in which the electronic device as described herein may be used, according to but one embodiment. System 700 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 700 includes an electronic device 100 comprising optical die structures and associated package substrates in accordance with embodiments described with respect to FIGS. 1-6. In an embodiment, an electronic device 100 comprising optical die structures and associated package substrates as described herein comprises or is coupled to an electronic system's processor 710 or memory 720.

Electronic system 700 may include bus 705 or other communication device to communicate information, and processor 710 coupled to bus 705 that may process information. While electronic system 700 may be illustrated with a single processor, system 700 may include multiple processors and/or co-processors. In an embodiment, processor 710 is part of an electronic device 100 comprising optical die structures and associated package substrates in accordance with embodiments described herein. In an embodiment, processor 710 is a semiconductor die of electronic device 100. System 700 may also include random access memory (RAM) or other storage device 720 (may be referred to as memory), coupled to bus 705 and may store information and instructions that may be executed by processor 710.

Memory 720 may also be used to store temporary variables or other intermediate information during execution of instructions by processor 710. Memory 720 is a flash memory device in one embodiment. In another embodiment, memory 720 is coupled to an electronic device 100 comprising optical die structures and associated package substrates as described herein.

System 700 may also include read only memory (ROM) and/or other static storage device 730 coupled to bus 705 that may store static information and instructions for processor 710. Data storage device 740 may be coupled to bus 705 to store information and instructions. Data storage device 740 such as a magnetic disk or optical disc and corresponding drive may be coupled with electronic system 700.

Electronic system 700 may also be coupled via bus 705 to display device 750, such as a cathode ray tube (CRT) or liquid crystal display (LCD), to display information to a user. Alphanumeric input device 760, including alphanumeric and other keys, may be coupled to bus 705 to communicate information and command selections to processor 710. Another type of user input device is cursor control 770, such as a mouse, a trackball, or cursor direction keys to communicate information and command selections to processor 710 and to control cursor movement on display 750.

Electronic system 700 further may include one or more network interfaces 780 to provide access to network, such as a local area network. Network interface 780 may include, for example, a wireless network interface having antenna 785, which may represent one or more antennae. Network interface 780 may also include, for example, a wired network interface to communicate with remote devices via network cable 787, which may be, for example, an Ethernet cable, a coaxial cable, a fiber optic cable, a serial cable, or a parallel cable.

In one embodiment, network interface 780 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported. IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 780 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 700 includes one or more omnidirectional antennae 785, which may refer to an antenna that is at least partially omnidirectional and/or substantially omnidirectional, and a processor 710 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
a package substrate comprising a package substrate core, a dielectric layer coupled with the package substrate core, and one or more input/output (I/O) optical fibers coupled with the package substrate core or coupled with the dielectric layer, or a combination thereof, the one or more I/O optical fibers to guide I/O optical signals to and from the package substrate and to allow both input and output optical signals to travel through the one or more I/O optical fibers, the one or more I/O optical fibers comprising a first core and a second core, the first core comprising an input signal pathway and the second core comprising an output signal pathway, the one or more I/O optical fibers comprising a first core cladding material coupled with the first core and a first buffer coupled with the first core cladding materials, the first core cladding material and the first buffer materials being disposed between the first core and the second core, and the first core comprising a central structure of the one or more I/O optical fibers and the second core comprising a structure that surrounds the first core.

2. An apparatus according to claim 1, further comprising one or more multi-mode fibers, the one or more multi-mode fibers comprising a single core that allows an input signal comprising a first wavelength and an output signal comprising a second wavelength to travel along the single core, the second wavelength being different than the first wavelength.

3. An apparatus according to claim 1, further comprising:
one or more package substrate power-delivery bumps coupled to a central region of the package substrate; and
a semiconductor die coupled with the package substrate, the semiconductor die comprising one or more semiconductor die power-delivery bumps coupled to a central region of the semiconductor die, the one or more semiconductor die power-delivery bumps being coupled to the package substrate power delivery bumps, the semiconductor die further comprising one or more I/O optical structures disposed in a peripheral region of the semiconductor die, the one or more I/O optical structures of the semiconductor die being optically coupled to the one or more I/O optical fibers of the package substrate.

4. An apparatus according to claim 3, wherein the one or more I/O optical structures of the semiconductor die comprise light-emitting diodes, lasers, or a combination thereof, the apparatus further comprising:
a solder-resist layer coupled with the dielectric layer; and
an optically transparent underfill layer coupled with the solder-resist layer and coupled with the semiconductor die, the one or more I/O optical structures of the semiconductor die and the one or more I/O optical fibers of the package substrate being substantially aligned to allow transmission of the I/O optical signals, or reception of the I/O optical signals, or a combination thereof, through the optically transparent underfill layer.

5. An apparatus according to claim 4, wherein the one or more I/O optical fibers further comprising a second core cladding material coupled to the second core and a second buffer coupled with the second core cladding material, the second core cladding material and the second buffer comprising a structure surrounding the second core.

6. An apparatus according to claim 5, wherein the first buffer comprises a resin-based material or a low-porosity polymer, or a combination thereof, and
wherein the second buffer comprises a resin-based material or a low-porosity polymer, or a combination thereof.

7. An apparatus according to claim 1, further comprising:
a circuit board coupled to the package substrate, the circuit board comprising one or more I/O optical structures, the one or more I/O optical structures of the circuit board being coupled to the one or more I/O optical fibers of the package substrate to guide I/O optical signals to and from the circuit board.

8. An apparatus, comprising:
a semiconductor die comprising one or more power-delivery bumps and one or more I/O optical structures to guide I/O optical signals to and from the semiconductor die, the one or more I/O optical structures comprising light-emitting diodes (LED), or lasers, or a combination thereof and
a package substrate coupled with the semiconductor die, the package substrate comprising one or more I/O optical fibers optically coupled with the one or more I/O optical structures, the one or more I/O optical fibers to guide I/O optical signals to and from the package substrate and to allow both input and output optical signals to travel through the one or more I/O optical fibers, the one or more I/O optical fibers comprising a first core and a second core, the first core comprising an input signal pathway and the second core comprising an output signal pathway, the one or more I/O optical fibers comprising a first core cladding material coupled to the first core and a first buffer coupled with the first core cladding materials, the first core cladding material and the first buffer materials being disposed between the first core and the second core, and the first core comprising a central structure of the one or more I/O optical fibers and the second core comprising a structure that surrounds the first core.

9. An apparatus according to claim 8, wherein the one or more I/O optical structures comprise:
a light emitter disposed in a central region of the one or more I/O optical structures, the light emitter to transmit I/O optical signals from the semiconductor die;
a light receiver disposed in a peripheral region of the one or more I/O optical structures that surrounds the light emitter, the light receiver to receive I/O optical signals; and
a divider disposed between the light emitter and the light receiver.

10. An apparatus according to claim 8, wherein the one or more I/O optical structures comprise one or more vertical cavity surface emitting lasers (VCSEL) coupled to a peripheral region of the semiconductor die, the one or more power-delivery bumps being coupled to a central region of the semiconductor die.

11. An apparatus according to claim 10, wherein the one or more VCSELs comprise one or more semiconductor films, and at least one of the semiconductor films comprising a quantum-well light source for the one or more I/O optical structures of the semiconductor die.

12. An apparatus according to claim 11, wherein the one or more I/O optical fibers further comprising a second core cladding material coupled to the second core and a second buffer coupled with the second core cladding material, the second core cladding material and the second buffer comprising a structure surrounding the second core.

13. An apparatus according to claim 12, wherein the first buffer comprises a resin-based material or a low-porosity polymer, or a combination thereof, and
wherein the second buffer comprises a resin-based material or a low-porosity polymer, or a combination thereof.

14. An apparatus according to claim 8, further comprising:
a circuit board coupled with the package substrate, the circuit board comprising one or more I/O optical structures, and the one or more I/O optical structures of the circuit board being coupled to the one or more I/O optical fibers of the package substrate to guide I/O optical signals to and from the circuit board.

15. An apparatus according to claim 8, further comprising:
an interposer coupled with the semiconductor die; and
a circuit board optically coupled with the semiconductor die through the interposer.

16. An apparatus according to claim 8, further comprising:
a circuit board coupled with the semiconductor die by a direct chip attach method, the circuit board being optically coupled with the semiconductor die.

17. A method, comprising:
fabricating a package substrate comprising one or more input/output (I/O) optical fibers to guide I/O optical signals to and from the package substrate, the one or more I/O optical fibers allowing both input and output optical signals to travel through the one or more I/O optical fibers, fabricating a package substrate comprising:
depositing a first cladding material on a first core material of the one or more I/O optical fibers;
depositing a first buffer material on the first cladding material;
depositing a second core material on the first buffer material;
depositing a second cladding materials on the second core material; and
depositing a second buffer material on the second cladding material;
fabricating a semiconductor die comprising one or more I/O optical structures to guide I/O optical signals to and from the semiconductor die, the one or more I/O optical structures comprising light-emitting diodes (LED), lasers, or combinations thereof; and
optically coupling the one or more I/O optical structures of the semiconductor die with the one or more I/O optical fibers of the package substrate.

18. A method according to claim 17, wherein fabricating the package substrate comprises weaving the one or more I/O optical fibers into a substrate core of the package substrate or depositing the one or more I/O optical fibers into a build-up dielectric layer of the package substrate.

19. A method according to claim 17, wherein fabricating the semiconductor die comprises:
depositing one or more semiconductor films to one or more electrically conductive I/O structures of the semiconductor die, at least one of the semiconductor films being disposed to provide a quantum-well light source for the one or more I/O optical structures of the semiconductor die;
patterning the one or more deposited semiconductor films to form a circular light-emitting region of the one or more I/O optical structures and an annular light-absorbing region coupled to the circular light emitting region, the annular light-absorbing region surrounding the circular light-emitting region; and
coupling the I/O optical structures to an I/O power source.

20. A method according to claim 19, further comprising:
covering the I/O optical structures using a protective film;
depositing one or more power delivery bumps on the semiconductor die; and
removing the protective film from the I/O optical structures.

21. A method according to claim 20, wherein the first buffer comprises a resin-based material or a low-porosity polymer, or a combination thereof, and
wherein the second buffer comprises a resin-based material or a low-porosity polymer, or a combination thereof.

22. A method according to claim 17, wherein optically coupling the one or more I/O optical structures of the semiconductor die with the one or more I/O optical fibers of the package substrate comprises:
depositing an optically transparent underfill between the package substrate and the semiconductor die; and
coupling the one or more I/O optical fibers directly to the one or more I/O optical structures or aligning the one or more I/O optical fibers with the one or more I/O optical structures to allow optical signals to travel through the optically transparent underfill, or a combination thereof.

23. A method according to claim 17, further comprising:
coupling a circuit board with the package substrate, the circuit board comprising one or more I/O optical structures, and the one or more I/O optical structures of the circuit board being optically coupled to the one or more I/O optical fibers of the package substrate to guide I/O optical signals to and from the circuit board.

* * * * *

UNITED STATES PATENT AND TRADEMARK OFFICE
CERTIFICATE OF CORRECTION

| | | |
|---|---|---|
| PATENT NO. | : 7,831,115 B2 | Page 1 of 1 |
| APPLICATION NO. | : 12/052650 | |
| DATED | : November 9, 2010 | |
| INVENTOR(S) | : Omar Bchir et al. | |

It is certified that error appears in the above-identified patent and that said Letters Patent is hereby corrected as shown below:

In column 12, line 38, in Claim 8, delete "thereof" and insert -- thereof; --, therefor.

Signed and Sealed this
Twenty-second Day of March, 2011

David J. Kappos
*Director of the United States Patent and Trademark Office*